United States Patent [19]
Miyano

[11] Patent Number: 6,078,200
[45] Date of Patent: Jun. 20, 2000

[54] CLOCK SIGNAL GENERATOR

[75] Inventor: Kazutaka Miyano, Tokyo, Japan

[73] Assignee: NEC Corporation, Tokyo, Japan

[21] Appl. No.: 09/124,769

[22] Filed: Jul. 30, 1998

[30] Foreign Application Priority Data

Jul. 31, 1997 [JP] Japan ................................. 9-205932

[51] Int. Cl.$^7$ .................................................. H03L 7/00
[52] U.S. Cl. ......................... 327/142; 327/244; 327/254; 327/255
[58] Field of Search .................................. 327/141, 142, 327/144, 231, 237, 238, 243, 244, 245, 254, 255, 258

[56] References Cited

U.S. PATENT DOCUMENTS

| 4,642,573 | 2/1987 | Noda et al. | 329/50 |
| 5,614,855 | 3/1997 | Lee et al. | 327/158 |
| 5,732,109 | 3/1998 | Takahashi | 375/326 |

FOREIGN PATENT DOCUMENTS

| 8-130464 | 5/1996 | Japan . |
| 9-17179 | 1/1997 | Japan . |
| 11-17529 | 1/1999 | Japan . |

OTHER PUBLICATIONS

NEC Technical Journal, vol. 47, No. 3, Mar. 25, 1994, 11 pgs.

*Primary Examiner*—Timothy P. Callahan
*Assistant Examiner*—Hai L. Nguyen
*Attorney, Agent, or Firm*—Sughrue, Mion, Zinn, Macpeak & Seas, PLLC

[57] ABSTRACT

A clock signal generator includes a phase shifter for generating four clock signals having phases consecutively shifted from one another by 90 degrees based on an external clock signal, a mixer for mixing two of the four clock signals to output an internal clock signal, and an initializing circuit for selecting consecutively one and another of the four clock signals as an internal clock signal in an initializing period. A phase comparator compares the internal clock signal against the external clock signal in the initializing period to determine which of the internal clock signal and the external clock signal leads. The initializing circuit reduces the time length for locking of the internal clock signal to the external clock signal in an operational period of the mixer.

9 Claims, 10 Drawing Sheets

CLOCK SIGNAL GENERATOR

BACKGROUND OF THE INVENTION (a) Field of the Invention

The present invention relates to a clock signal generator and, more particularly, to a clock signal generator generally known as a delay locked loop (DLL) that generates an internal clock signal in synchrony with an external clock signal.

(b) Description of Related Art

Recently, it is desired that the data transfer rates increases between integrated circuits. However, the data transfer rate is generally limited by the difference in the propagation rate between an external clock signal and an internal clock signal in each component of an integrated circuit. To circumvent this problem, some proposals have been offered to enable integrated circuits to output data in synchrony with external clock signals by synchronizing the internal clock signal with the external clock signal, even if different propagation delays exist between the data and the control signal for controlling the input/output of the data.

The proposals include employment of a DLL circuit, by which the internal clock signal is generated in synchrony with the external clock. A conventional DLL circuit is described in JP-A-8(1996)-130464, for example. FIG. 1 is a block diagram illustrating the described DLL circuit or clock signal generator.

In the clock signal generator of FIG. 1, a voltage-controlled delay element 1 is used to generate an internal clock signal having a desired phase. A phase comparator 2 detects the phase difference between the external clock signal and the internal clock signal. If the internal clock leads the external clock in phase, an additional delay is provided to the voltage-control delay element 1 by using a control signal supplied from a charge pump 3. On the other hand, if the internal clock lags behind the external clock in phase, the delay by the voltage-controlled delay element 1 is decreased. The amount of the phase shift is determined by a setting of the charge pump 3. Generally, the operational stability of the clock signal generator increases after locking to a desired phase, by slowing the rate of phase shift, however, this takes a longer period (length) of time until the internal clock is locked with the external clock.

The conventional clock generator shown in FIG. 1 requires a maximum time length corresponding to a maximum 180 degrees of a phase shift amount from starting of the operation of the clock signal generator to locking of the internal clock to a desired phase. Reduction of the time length required for the phase shift operation lowers the operational stability of the clock signal generator after locking. Specifically, about 180 degrees/2.5 microseconds are required for the phase shift rate (velocity), which requires as much as about 2.5 microseconds for the internal clock to be locked after the start of, or a standby mode of the clock signal generator.

FIG. 2 shows another conventional clock signal generator using a phase shifter. The clock signal generator comprises the phase shifter 11, a quadrant selector 12, a mixer 13, a phase comparator 14, and a charge pump 15. Referring additionally to FIG. 3 showing a signal timing chart of the clock signal generator of FIG. 2, an external clock signal is supplied to the phase shifter 11 to generate four clock signals including I, Q, I_Q, and Q_B clocks, each having the same period as the external clock. The phases of these clock signals are such that a phase difference of 90 degrees exists between each adjacent two of the clock signals, as shown in FIG. 3. These four clocks are input to the mixer 13.

The external clock is supplied to the phase comparator 14 to be compared in phase with the internal clock output from the mixer 13. The result of the comparison is supplied to the mixer 13 as well as the quadrant selector 12. The quadrant selector 12 selects signal ISEL or QSEL based on the quadrant switching signal, and the selected signal is supplied to the mixer 13. The selected signal ISEL selects one of the output clocks I and I_B from the phase shifter 11 and the selected signal QSEL selects one of the output clocks Q and Q_B. In the example of FIG. 3, a clock IJX, obtained by the selection by the select signal ISEL, represents the clock I, and a clock QJX, obtained by the selected signal QSEL, represents the clock Q.

The mixer 13 mixes these two selected signals IJX and QJX by a stepless regulation based on signals supplied from the charge pump 15 to generate a mixed signal JX, which is then amplified by an amplifier, not shown. The amplified signal is output from the clock signal generator as the internal clock signal, which is in synchrony with the external clock signal.

In the conventional clock signal generator of FIG. 2, a lower phase shift rate raises the stability of the clock signal generator after locking of the internal clock to a desired phase, as is the case of the conventional clock generator of FIG. 1, and which involves a similar problem.

SUMMARY OF THE INVENTION

It is therefore an object of the present invention to provide a clock signal generator capable of reducing the time length required for the internal clock signal to lock with the external clock signal, thereby generating a desired phase delay in a short time.

The present invention provides a clock signal generator comprising: a phase shifter for receiving an external clock signal having a first clock period and outputting at least three first clock signals having the first period and phases shifted consecutively from one another; a mixer for selecting two of the first signals and for mixing the selected two of the first signals based on a mixing control signal, to output an internal clock signal; a phase comparator for comparing the internal clock signal against the external clock signal, to output a comparison signal representing a phase difference between the external clock signal and the internal clock signal and also representing whether the external clock signal leads of lags the internal clock signal; a mixing ratio controller for generating mixing control signals based on the phase difference; and an initializing circuit for controlling the mixer to select one of the first clock signals as the initial internal clock signal, and subsequently to select another of the first clock signals as the internal clock signal based on the comparison signal when the mixer selects one of the first clock signals.

In accordance with the clock signal generator of the present invention, since the phase comparator can detect which of the first clock signals is nearer to the desired phase during the initializing period, the mixer can output an initial internal signal having a lower phase difference between the internal clock signal and the desired phase. Accordingly, the time length required for lock-in of the internal clock signal can be reduced.

The above and other objects, features and advantages of the present invention will be more apparent from the following description, referring to the accompanying drawings.

DETAILED DESCRIPTION OF THE PREFERRED EMBODIMENTS

Figure 1:
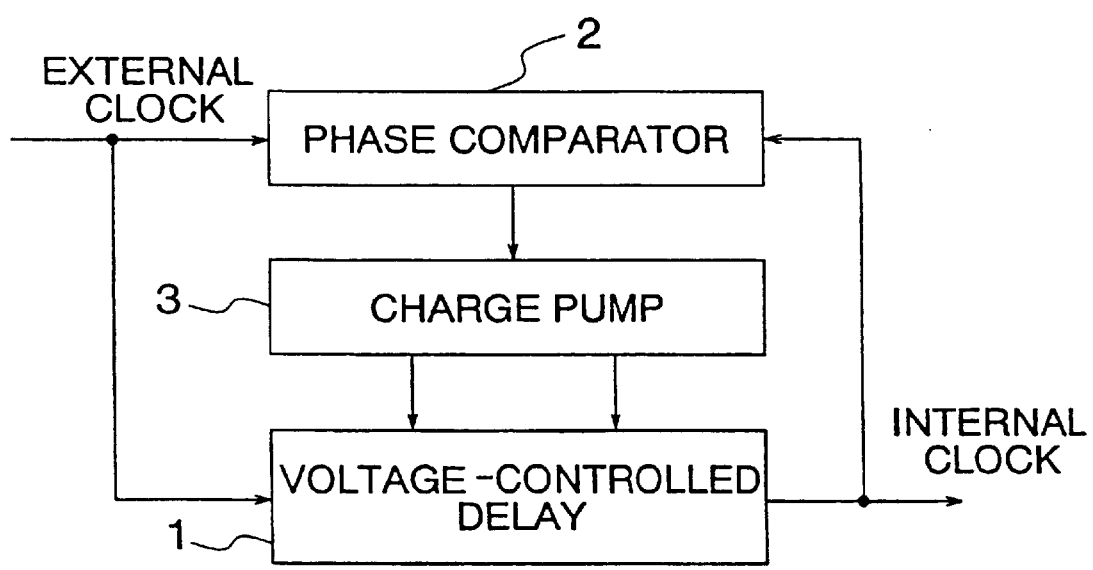
FIG. 1 is a block diagram of a conventional clock signal generator.
Figure 2:
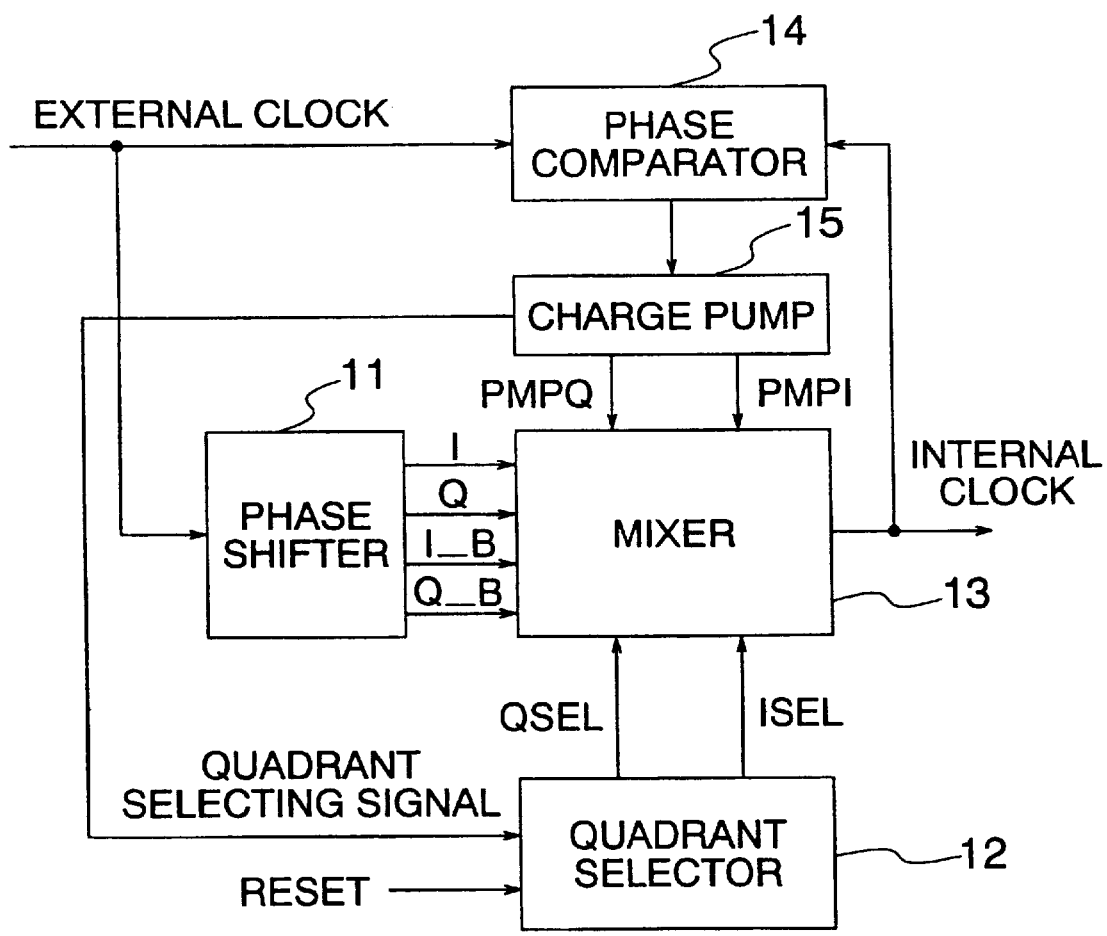
FIG. 2 is a block diagram of another conventional clock signal generator.
Figure 3:
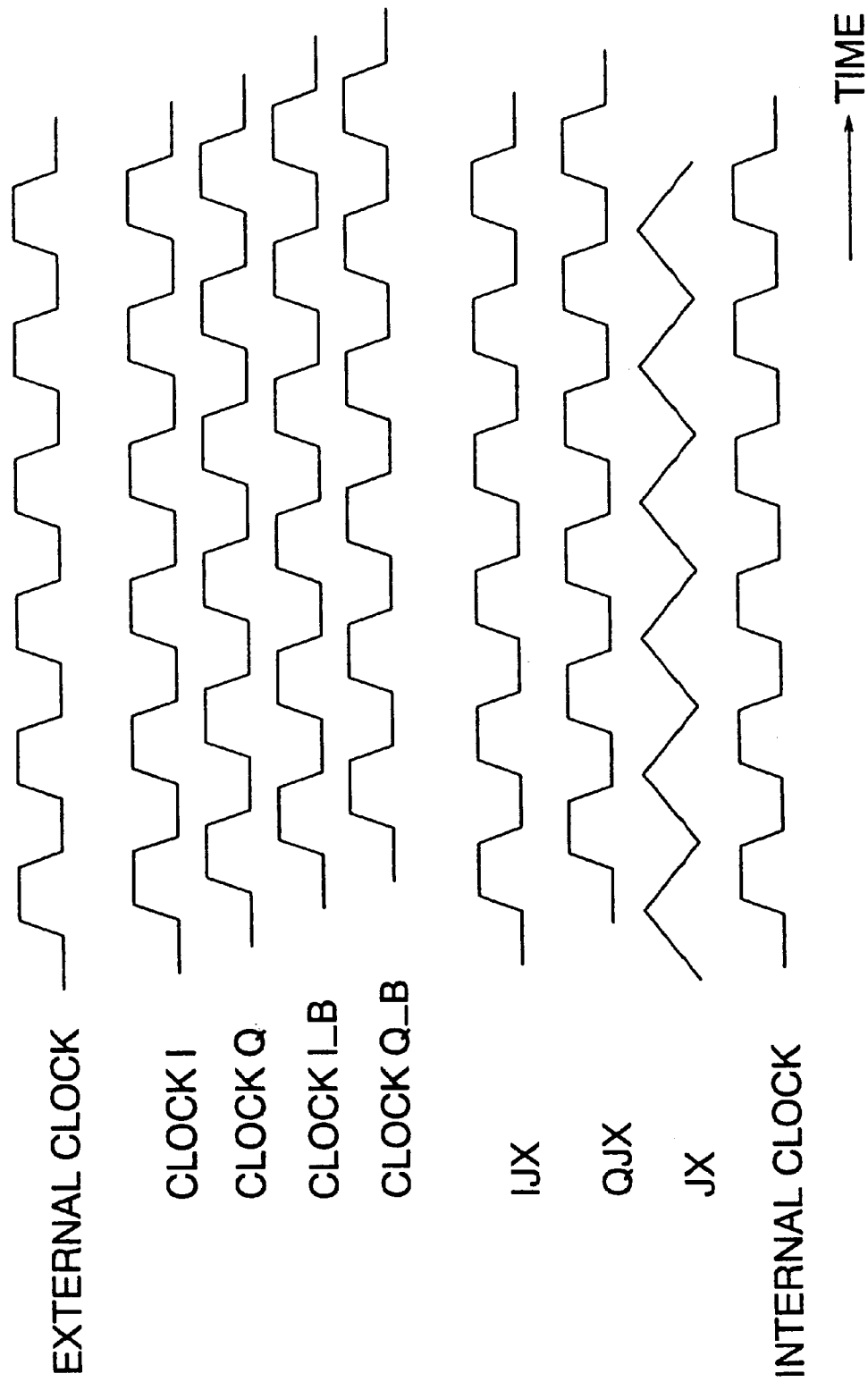
FIG. 3 is a signal timing chart of the clock signal generator of FIG. 2.

Now, the present invention is more specifically described with reference to accompanying drawings, wherein similar constituent elements are designated by similar reference numerals throughout the drawings.

Figure 4:
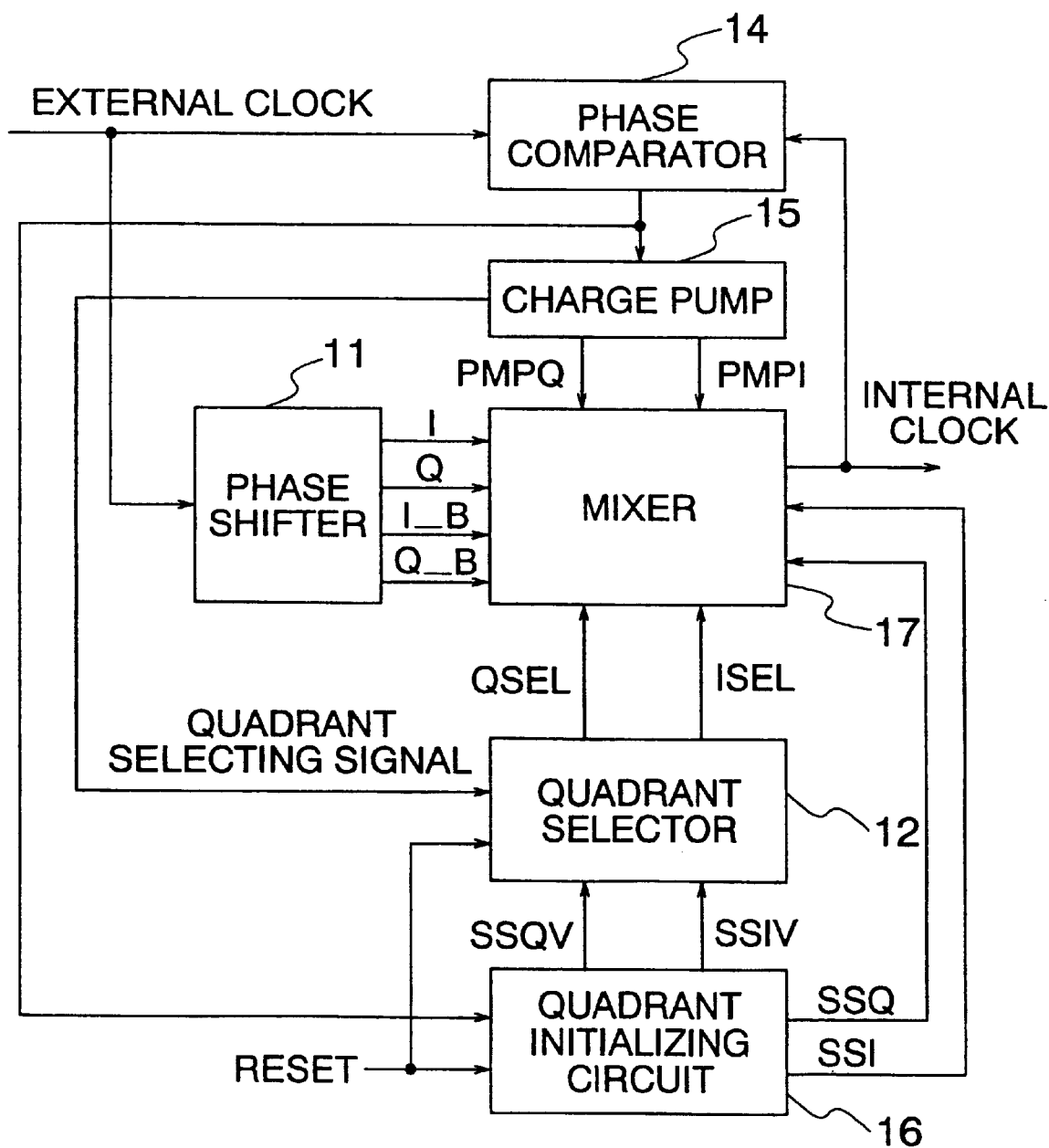
FIG. 4 is a block diagram of a clock signal generator according to a first embodiment of the present invention.

Referring to FIG. 4, a clock signal generator according to a first embodiment of the present invention comprises a phase shifter 11 for receiving an external clock signal and generating four clock signals I, Q, I_B and Q_B having a phase difference of 90 degrees between each adjacent two of the clock signals, a quadrant selector 12, a mixer 17 for selecting two of the output signals from the phase shifter 11 based on output signals from the quadrant selector 12 and mixing the thus selected signals to generate an internal clock signal, a phase comparator 14 for detecting a phase difference between the external clock signal and the internal clock signal, a charge pump 15 for controlling the ratio of phase mixing by the mixer 17, and a quadrant initializing circuit 16.

Figure 5:
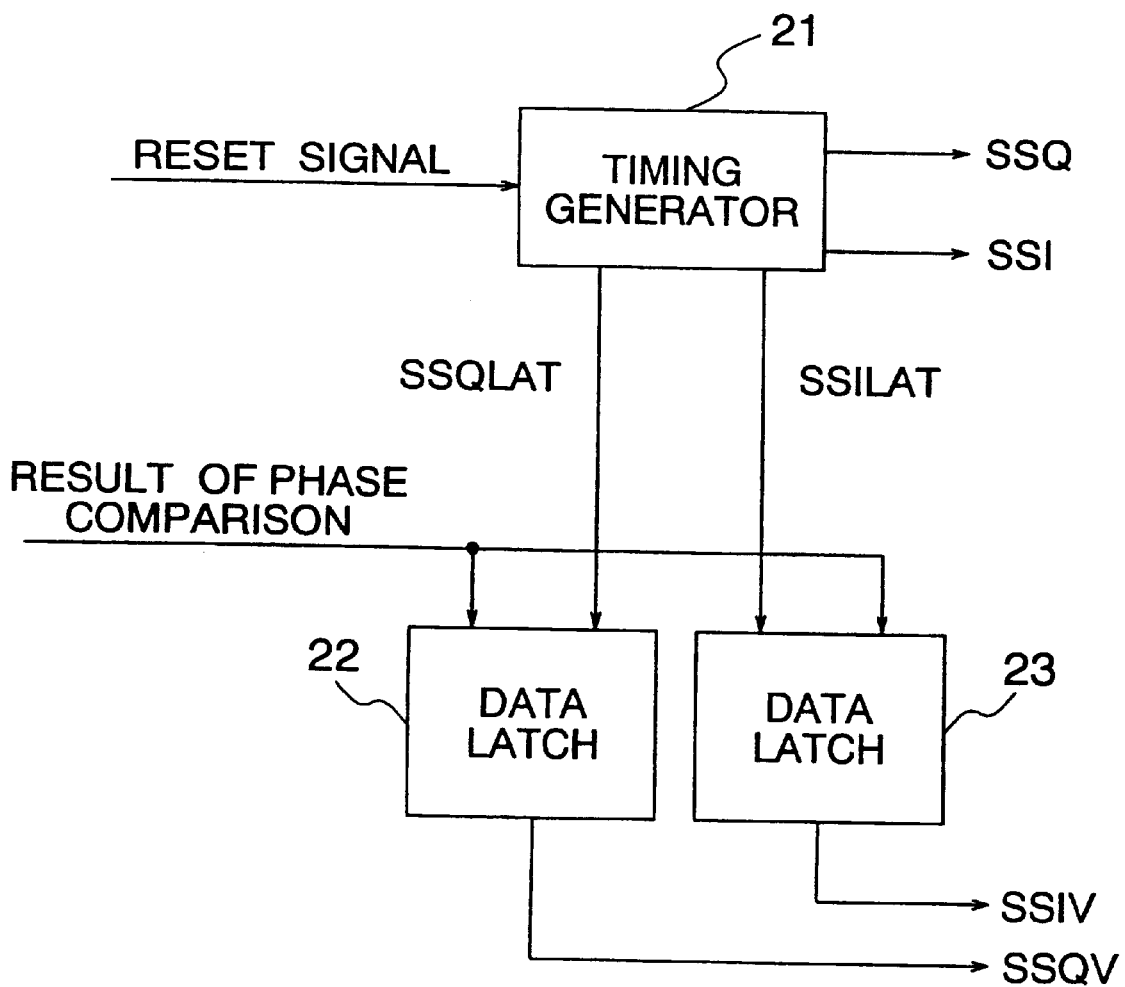
FIG. 5 is a block diagram of a quadrant initializing circuit shown in FIG. 4.

The quadrant initializing circuit 16 sets an initial quadrant value in the quadrant selector 12. Referring to FIG. 5, an exemplified quadrant initializing circuit 16 comprises a timing generator 21 for receiving a reset signal, and for delivering signals SSQ and SSI to the mixer 17 and internal signals SSQLAT and SSILAT, and data latch circuits 22 and 23 for receiving the internal signals SSQLAT and SSILAT, respectively, from the timing generator 21 and a signal representing the result of the phase comparison from the phase comparator 14.

Figure 6:
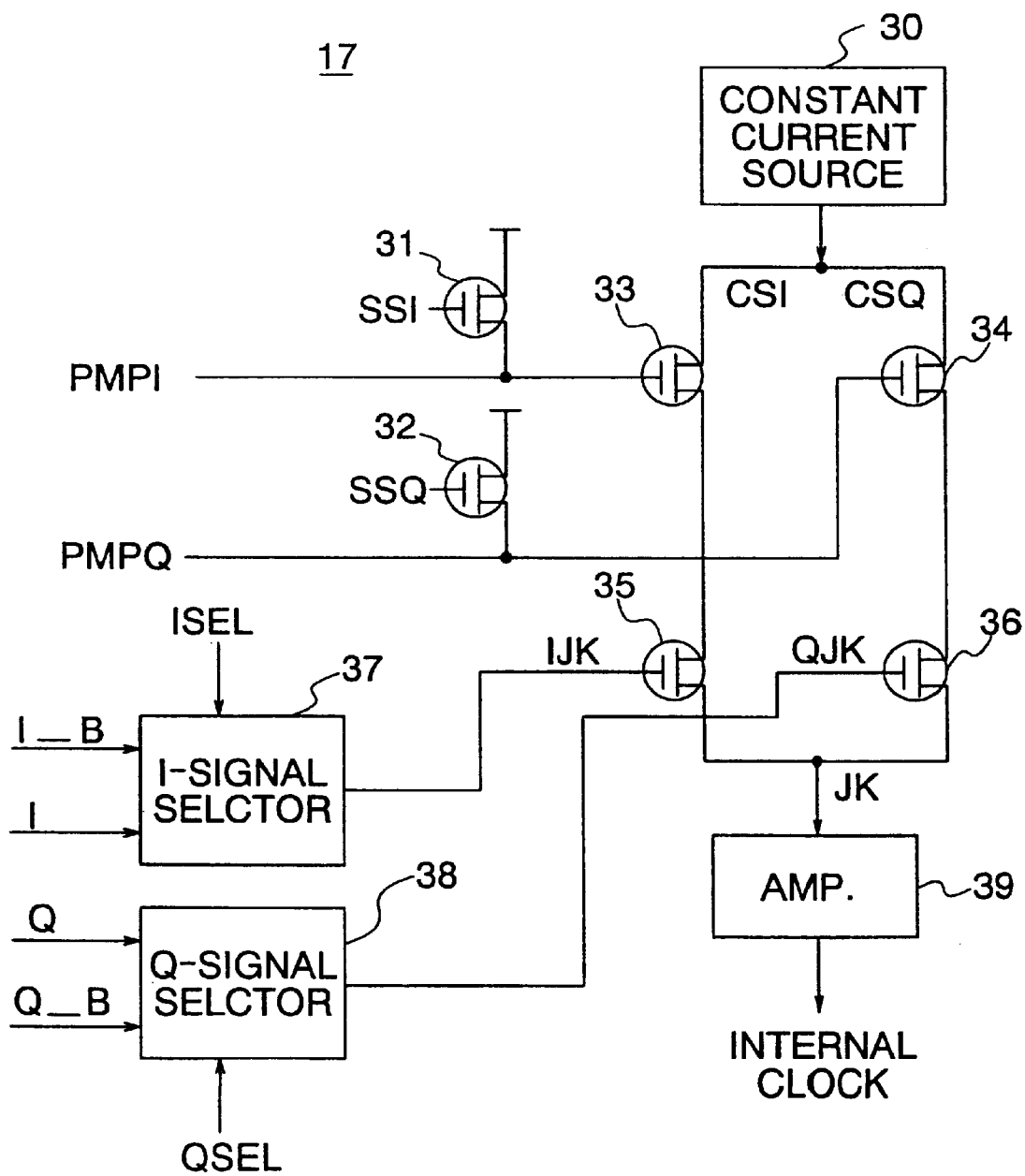
FIG. 6 is a circuit diagram of the mixer shown in FIG. 4.

Referring to FIG. 6, the mixer 17 shown in FIG. 4 comprises a constant current source 30, p-channel MOS transistors 31 to 36, an I-signal selector 37, a Q-signal selector 38, and an amplifier 39. The drain of the transistor 31 and the gate of the transistor 33 are connected to the PMPI output terminal of the charge pump 15. The drain of the transistor 32 and the gate of the transistor 34 are connected to the PMPQ output terminal of the charge pump 15.

The source of the transistor 35 is connected to the drain of the transistor 33, whereas the source of the transistor 36 is connected to the drain of the transistor 34. The drains of the transistors 35 and 36 are connected together to the amplifier 39. The gate of the transistor 35 is connected to the output terminal IJX of the I-signal selector 37. The gate of the transistor 36 is connected to the output QJX of the Q-signal selector 38. The constant current source 30 is connected to the sources of the transistors 33 and 34. The signal SSI from the quadrant initializing circuit 16 is supplied to the gate of the transistor 31, whereas the output signal SSQ from the quadrant initializing circuit 16 is supplied to the gate of the transistor 32.

Figure 7:
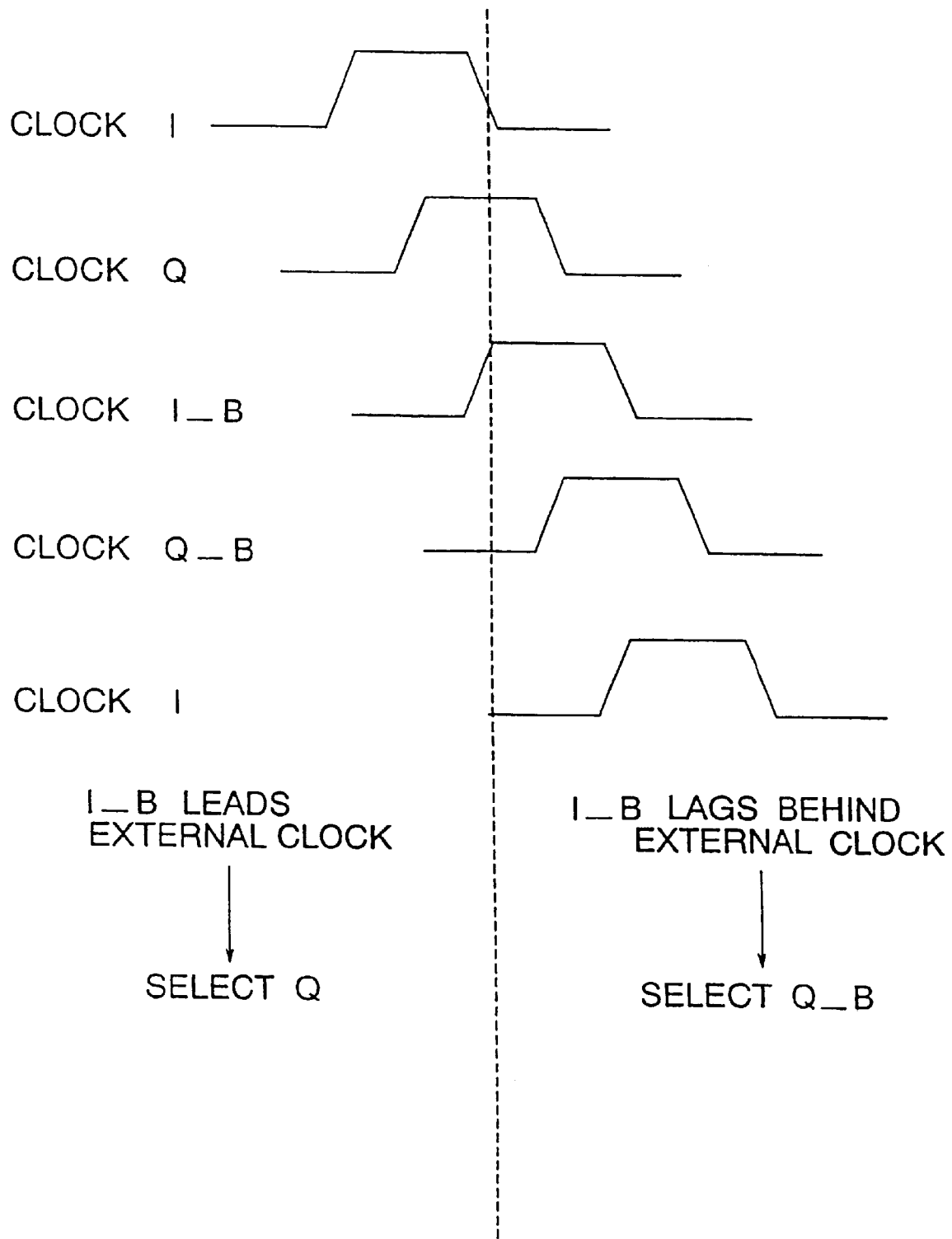
FIG. 7 is a signal timing chart for the operation of the clock signal generator of FIG. 4.

Referring additionally to FIG. 7, a clock pulse in the external clock signal is converted by the phase shifter 11 into four clock pulses represented by I, Q, I_B, and Q_B and having the same period as the external clock signal. The phases of these clock pulses I, Q, I_B, and Q_B lag consecutively by 90 degrees behind one another. The clock signals I and I_B are input to the I-signal selector 37 for selection in the mixer 17. The clock signals Q and Q_B are input to the Q-signal selector 38 for selection in the mixer 17. It should be noted that the clock pulse I depicted at the bottom of FIG. 7 corresponds to a succeeding clock pulse in the external clock signal.

Figure 8:
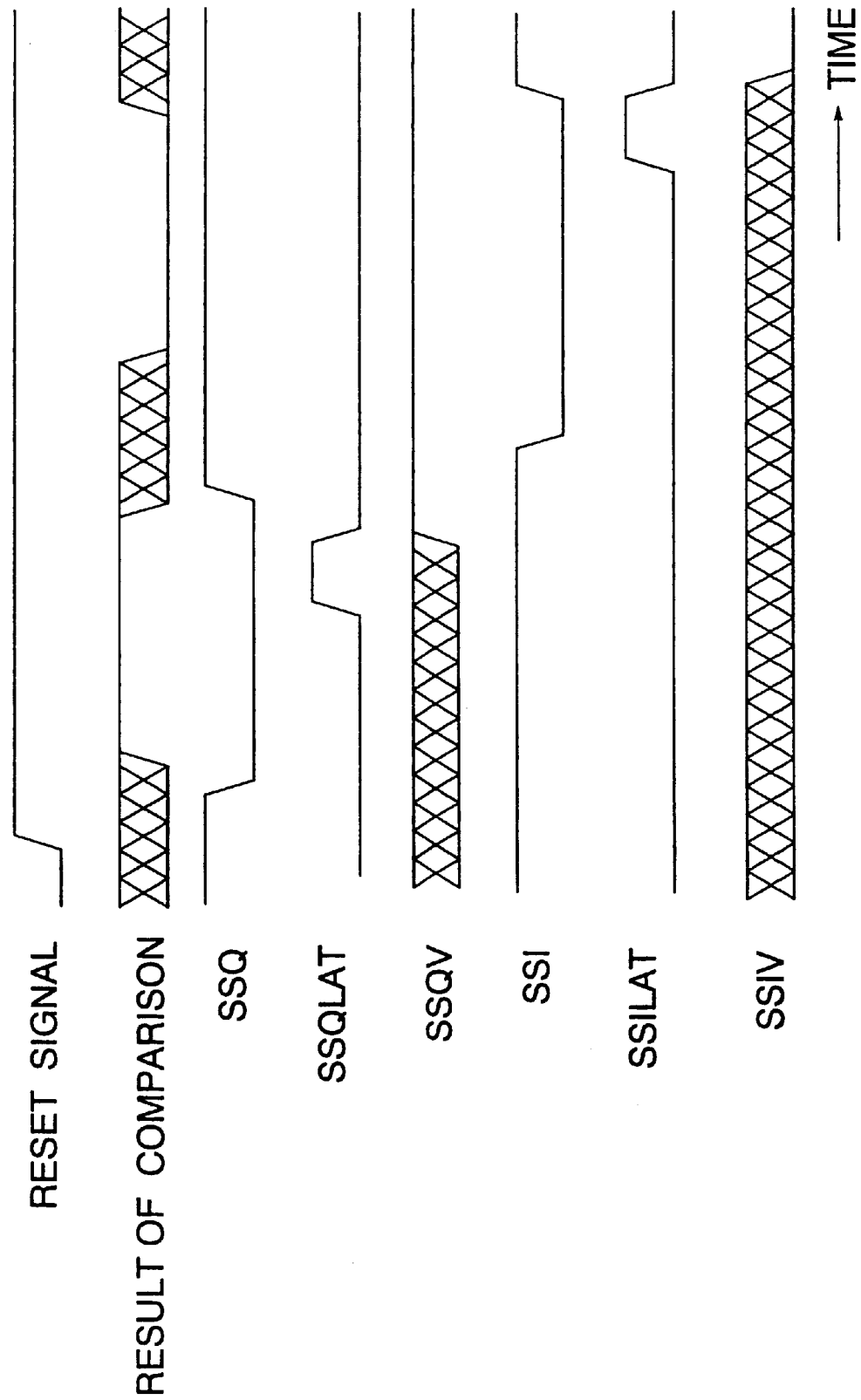
FIG. 8 is a signal timing chart for the operation of the quadrant initializing circuit of FIG. 5.

Referring to FIG. 8 showing an initializing period by the quadrant initializing circuit 16. Upon generation of a reset signal (high level of the reset signal), the timing generator 21 in the quadrant initializing circuit 16 outputs a low level of the signal SSQ having a pulse width of about 100 nanoseconds (ns), for example, and then outputs a low level of the signal SSI having a pulse width of about 100 ns.

The low level of the signal SSQ turns on the transistor 32 in the mixer 17, raising the potential of the PMPQ node in the mixer 17 to a high level and turning off the transistor 34. On the other hand, since the signal SSI is at a high level at this moment, the transistor 31 in the mixer 17 is off, allowing the signal PMPI to enter the gate of the transistor 33 in the mixer 17. Consequently, the ratio of a current CSI flowing through the transistor 33 to a current CSQ flowing through the transistor 34 is 100 to 0, for example.

Assuming that the clock I_B is selected by the I-signal selector 37 in the mixer 17 based on the output signals ISEL and QSEL from the quadrant selector 12 responding to the reset signal, the clock I_B is output at 100% from the mixer 17 through the transistor 35 and the amplifier 39 as the internal clock signal. If, at this moment, the internal clock I_B which is being output is found by the phase comparator 14 to lead the external clock in phase, then it means that a desired rising edge of the internal clock signal exists on the side of the clock I-B Pulse near the clock Q which lags behind the clock I_B by 90 degrees.

Likewise, if the internal clock I_B which is being output is found by the phase comparator 14 to lag behind the external clock in phase, then it means that a desired rising edge of the internal clock signal exists on the side near the clock Q_B which leads the clock I_B by 90 degrees. In short, the procedure as described heretofore indicates which of the clocks Q and Q_B is to be selected first.

After the signal SSQ rises and the signal SSI falls, the low level of the signal SSI turns on the transistor 31 in the mixer 17, raising the potential of the PMPI node in the mixer 17 and turning off the transistor 33. On the other hand, since the signal SSQ is at a high level at this moment, the transistor 32 in the mixer 17 is off, allowing the signal PMPQ to enter the gate of the transistor 34 in the mixer 17. Consequently, the ratio of the current CSI flowing through the transistor 33 to the current CSQ flowing through the transistor 34 is 0 to 100, for example.

Assuming that the clock Q_B is selected by the Q selector 37 in the mixer 17 based on the output signals ISEL and QSEL from the quadrant selector 12 responding to the reset signal, then the clock Q_B is output at 100% from the mixer 17 through the transistor 36 and the amplifier 39 as the internal clock signal. If, at this moment, the internal clock Q_B which is being output is found by the phase comparator 14 to lead the external clock signal in phase, then it means that a desired rising edge of the internal clock signal exists on the side near the clock I_B lagging behind the clock Q_B by 90 degrees.

Likewise, if the internal clock Q_B which is being output is found by the phase comparator 14 to lag behind the external clock signal, then it means that a desired rising edge of the internal clock signal exists on the side near the clock I leading the clock Q_B by 90 degrees. In short, the procedure as described heretofore indicates which of the clocks I and I_B is to be selected.

The phase of the external clock signal or the desired phase of the internal clock signal necessarily falls between the phases of the two clocks thus selected. At the end of the initializing period, both the signals SSQ and SSI assume a high level, and the phase of the internal clock is adjusted by stepless regulation based on the output signals PMPQ and PMPI from the charge pump 15.

Specifically, after both the signals SSQ and SSI assume a high level, both the transistors 31 and 32 in the mixer 17 are turned off. Consequently, the output signals PMPI and PMPQ from the charge pump 15 are supplied to the gates of the transistors 33 and 34, respectively, and the currents flowing through the transistors 35 and 36 vary according to the voltage ratio between the signals PMPI and PMPQ.

It is assumed that the clock I_B is selected by the I-signal selector 37 and the clock Q_B by the Q-signal selector 38 at the initialization immediately after the reset operation and that the internal clock which is being output is found leading the external clock. Then, in order to mix the clock I_B with the clock Q_B at a higher ratio of the clock I_B compared to the clock Q_B, the level of the signal PMPI is gradually increased compared with the signal PMPQ. Thus, the phase of the internal clock output from the mixer 17 gradually varies from the phase of the clock Q_B toward the phase of the clock I_B at a phase shifting rate defined by the charge pump 15, thereby finally reaching a proximity of the phase of the external clock signal or the desired phase of the internal clock signal.

After the phase of the internal clock signal passes the desired phase, the result of the phase comparison output from the phase comparator 14 is inverted. Based on this inversion, the phase of the output internal clock signal from the mixer 17 shifts in the opposite direction based on the output signals PMPI and PMPQ from the charge pump 15. After the phase of the internal clock passes the desired phase in the opposite direction, the result of the phase comparison output from the phase comparator 14 is inverted again. Subsequently, the result of the phase comparison output from the phase comparator 14 repeats inversion in the manner described above, thereby converging the phase of the internal clock signal output from the mixer 17 to a proximity of the desired phase. The state reached thus is referred to as a locked state, in which the clock signal generator can perform an input/output operation at a planned transfer rate.

If the result of the phase comparison made by the phase comparator 14 remains unchanged when the phase of the internal clock signal has gradually varied before the phase of the internal clock enters the locked state, reaching one of the phases of the clocks selected by the I-signal selector 37 and the Q-signal selector 38, no further phase shift can be made in the same direction. In such a case, the charge pump 15 outputs a quadrant switching signal to the quadrant selector 12 to switch between the clocks by the I-signal selector 37 and the Q-signal selector 38.

For example, when the phase mixing is effected between the clock I and the clock Q, and if the result of phase comparison remains unchanged after increasing the mixing ratio of the clock Q finally reaching the state in which the clock Q is output at 100%, the quadrant selector 12 stops the clock I and selects the clock I_B.

It should be noted that the quadrant initializing circuit 16 outputs a low-level of the signal SSQ through the timing generator 2 for a certain time interval immediately after the reset and, at the same time, turns the signal SSQLAT to a high level for a short time interval. This allows the data latch circuit 22 to latch the result of the phase comparison by the phase comparator 14. Likewise, while the low level of the signal SSI is output from the timing generator 21 for a certain time interval, the quadrant initializing circuit 16 turns the signal SSILAT to a high level for a short time interval, allowing the data latch circuit 23 to latch the result of phase comparison by the phase comparator 14 at this moment.

The result of the phase comparison, or phase comparison signal SSQV, latched in the data latch 22 and the phase comparison signal SSIV latched in the data latch 23 are input to the quadrant selector 12 as initial values for the operational period of the mixer 17.

Figure 9:
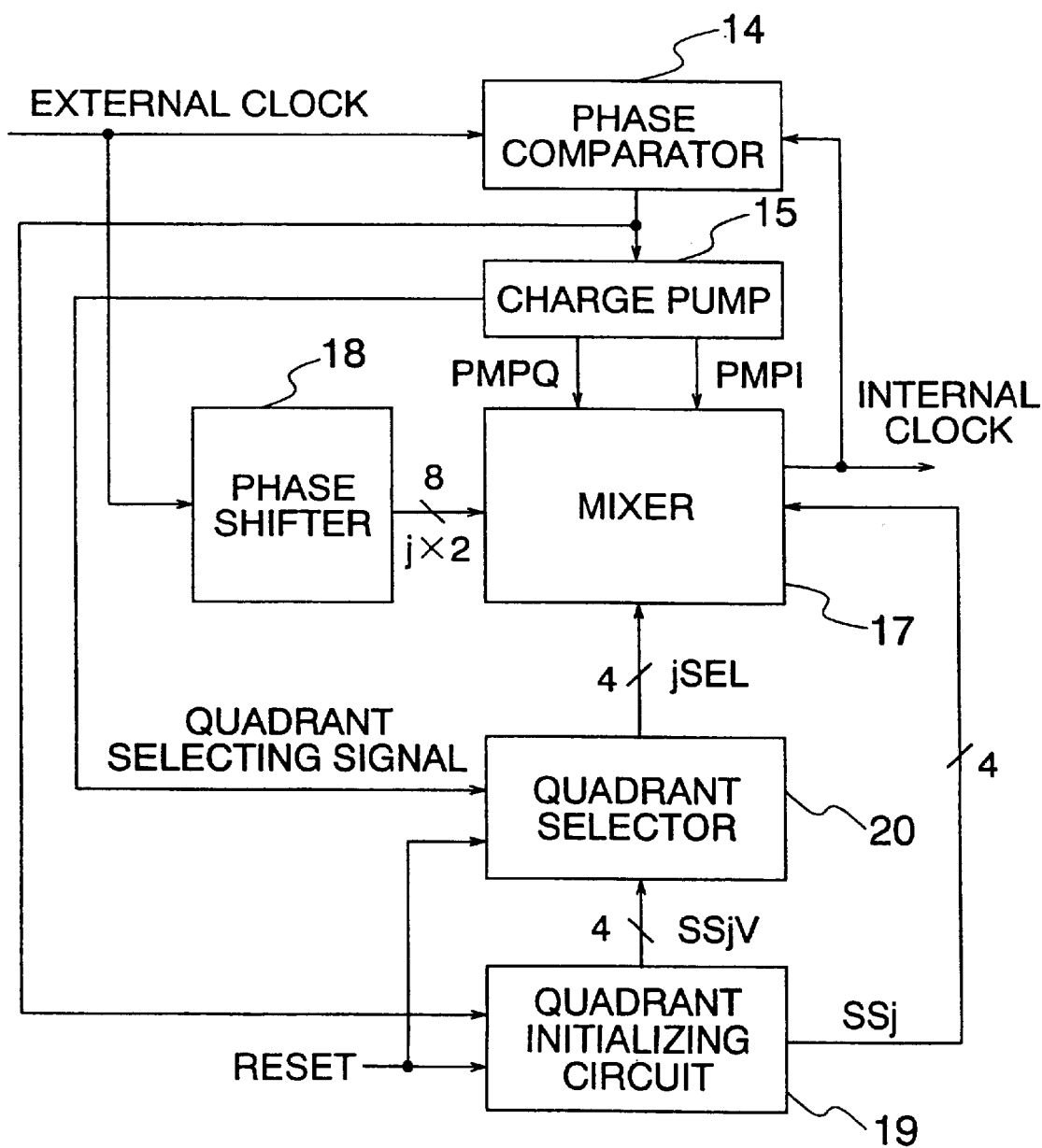
FIG. 9 is a block diagram of a clock signal generator according to a second embodiment of the present invention.
Figure 10:
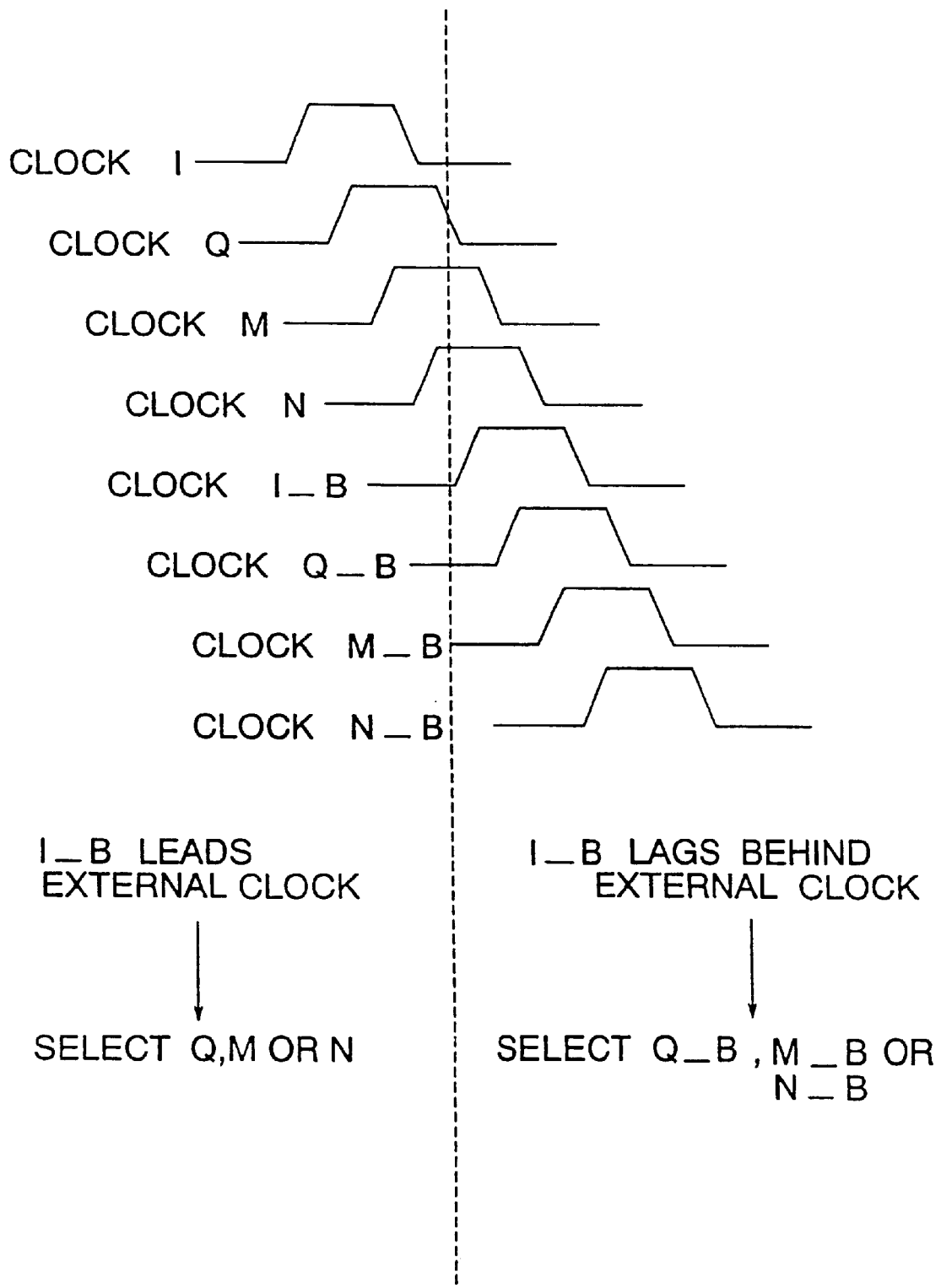
FIG. 10 is a signal timing chart for the operation of the clock signal generator of FIG. 9.

Referring to FIG. 9, a clock signal generator according to a second embodiment of the present invention is similar to the clock signal generator of FIG. 4 except for a phase shifter 18, a quadrant initializing circuit 19 and a quadrant selector 20. In the second embodiment, the external clock signal is converted by the phase shifter 18 into eight clock signals I, Q, M, N, I_B, Q_B, M_B, and N_B, which are shown in FIG. 10. The eight clock signals shown in FIG. 10 have the same period as the external clock, and a phase difference of 45 degrees between each adjacent two of the clock signals. These clocks are input to the mixer 17. A larger number of the clock signals output from the phase shifter 18 increases the scale of the clock signal generator in the second embodiment, and also the operational stability of the clock signal generator after completion of the locking.

In the second embodiment using these eight clock signals, only two of the signals are mixed for generating the internal clock signal. Accordingly, similarly to the first embodiment, one of the eight clocks is first output at 100% as an internal clock, then another is selected for mixing to output a desired phase for the internal clock signal.

For example, if the phase comparison after outputting 100% of the clock I_B in the initializing period reveals that the current internal clock leads the external clock, it means that the desired phase resides near the clock Q, M, or N. Next, if the clock M, for example, among the clocks Q, M and N is output at 100%, the result of the phase comparison at this moment indicates which of the clocks Q and N is to be selected. Performing the phase comparison three times allows selection of the initial two clocks to be mixed for generating the internal clock signal.

It should be noted that the quadrant initializing circuit 19 outputs four control signals SSj to the mixer 17 and outputs four initialing signals SSjV to the quadrant selector 20. In basic operations, however, the quadrant initializing circuit 19 is similar to the quadrant initializing circuit 16 of FIG. 4. The quadrant selector 20 outputs four quadrant selecting signals jSEL to the mixer 17 to select four of the eight clocks. In basic operations, however, the quadrant selector 20 is similar to the quadrant selector 12 of FIG. 4.

In the second embodiment, the number of initial comparisons is three compared with two in the first embodiment. However, the time length for scanning of the desired phase to be performed after the initial comparisons is only a half of that in the first embodiment.

While it takes a maximum of about 2.5 microseconds to lock the internal clock signal to a desired phase in the conventional clock signal generator, it takes a maximum of about 0.625 microsecond in the first embodiment, which is about ¼ of the conventional technique, and only about 0.32 microsecond in the second embodiment, which is about ⅛ of the conventional technique.

Since the above embodiments are described only for examples, the present invention is not limited to the above embodiments and various modifications or alterations can be easily made therefrom by those skilled in the art without departing from the scope of the present invention. For example, the phase shifter used in the present invention may convert the external clock pulse into three or more clock pulses having different phases.

What is claimed is:

1. A clock signal generator comprising:

a phase shifter for receiving an external clock signal having a first clock period to output at least three first clock signals having said first period and phases shifted consecutively from one another, said phase shifter being connected to and outputting said first clock signal to a mixer;

said mixer for selecting two of said first clock signals, for mixing the selected two of said first signals based on mixing control signals received from a mixing ratio controller, and to output an internal clock signal;

a phase comparator connected to said mixer and receiving said internal clock signal therefrom, for comparing said internal clock signal against said external clock signal to output a comparison signal representing a phase difference between said external clock signal and said internal clock signal and also representing whether said external clock signal leads or lags said internal clock signals;

said mixing ratio controller connected to said phase comparator and said mixer, receiving said comparison signal from said phase comparator representing said phase difference, generating said mixing control signal based on said phase difference and outputting said mixing control signals to said mixer; and an initializing circuit connected to said phase comparator, said mixing ratio controller, and said mixer receiving said comparison signal from said phase comparator, and outputting signals to said mixing ratio controller and said mixer for controlling said mixer to select one of said first clock signals as an initial internal clock signal during an initialization period so as to determine which two of said first clock signals are to be selected in said mixer thereafter.

2. A clock signal generator as defined in claim 1, wherein said at least three first clock signals output from said phase shifter include four first clock signals having phases shifted consecutively by 90 degrees from one another, and said initializing circuit controls said mixer to select a second of said first clock signals as said initial internal clock signal based on said comparison signal when said mixer selects said one of said first clock signals during said initialization period.

3. A clock signal generator as defined in claim 2, wherein said initializing circuit receives said comparison signal when said mixer outputs said another of said first clock signals during said initializing period.

4. A clock signal generator as defined in claim 1, wherein said at least three first clock signals output from said phase shifter include eight first clock signals having phases shifted consecutively by 45 degrees from one another.

5. A clock signal generator as defined in claim 4, wherein said initializing circuit controls said mixer to select consecutively a second and a third of said eight first clock signals as said initial internal clock signal based on said comparison signal when said mixer selects said one of said first clock signals during said initialization period.

6. A clock signal generator as defined in claim 1, wherein said mixing ratio controller comprises a quadrant selector interconnected with a charge pump, and an initializing circuit connected to, and setting an initial said quadrant value in, said quadrant selector during said initialization period.

7. A clock signal generator as defined in claim 2, wherein said mixing ratio controller comprises a quadrant selector interconnected with a charge pump, and an initializing circuit connected to, and setting an initial said quadrant value in, said quadrant selector during said initialization period.

8. A clock signal generator as defined in claim 4, wherein said mixing ratio controller comprises a quadrant selector interconnected with a charge pump, and initializing circuit connected to and setting an initial said quadrant value in said quadrant selector during said initialization period.

9. A clock signal generator as defined in claim 5, wherein said mixing ratio controller comprises a quadrant selector interconnected with a charge pump, and an initializing circuit connected to, and setting an initial said quadrant value in, said quadrant selector during said initialization period.

* * * * *